(12) United States Patent
Zhang et al.

(10) Patent No.: US 10,325,813 B2
(45) Date of Patent: Jun. 18, 2019

(54) FIN CUT PROCESS AND FIN STRUCTURE

(71) Applicants: Semiconductor Manufacturing International (Shanghai) Corporation, Shanghai (CN); Semiconductor Manufacturing International (Beijing) Corporation, Beijing (CN)

(72) Inventors: Hai Yang Zhang, Shanghai (CN); Fangyuan Xiao, Shanghai (CN); Yan Wang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/728,204

(22) Filed: Oct. 9, 2017

(65) Prior Publication Data

US 2018/0144986 A1 May 24, 2018

(30) Foreign Application Priority Data

Nov. 23, 2016 (CN) .......................... 2016 1 1046394

(51) Int. Cl.
*H01L 21/8234* (2006.01)
*H01L 21/311* (2006.01)
(Continued)

(52) U.S. Cl.
CPC .. *H01L 21/823481* (2013.01); *H01L 21/0332* (2013.01); *H01L 21/0337* (2013.01);
(Continued)

(58) Field of Classification Search
None
See application file for complete search history.

(56) References Cited

U.S. PATENT DOCUMENTS

2007/0111455 A1 5/2007 Kim et al.
2014/0117454 A1 5/2014 Liu et al.
(Continued)

OTHER PUBLICATIONS

European Application No. 17202998.5, Extended European Search Report dated Apr. 6, 2018, 8 pages.
(Continued)

*Primary Examiner* — Mounir S Amer
(74) *Attorney, Agent, or Firm* — Kilpatrick Townsend & Stockton LLP

(57) ABSTRACT

A method for manufacturing a semiconductor device includes providing a substrate structure including a substrate, semiconductor fins extending in a first direction on the substrate, a hardmask layer on the semiconductor fins, and an isolation region surrounding the semiconductor fins and having an upper surface flush with the hardmask layer, the isolation region including a first region on a side of the semiconductor fins in the first direction and a second region on a side of the semiconductor fins in a second direction different from the first direction. The method also includes removing the hardmask layer, etching a portion of the first region above the semiconductor fins, forming a mask layer on the semiconductor fins and a remaining first region, etching the second region such that an upper surface of the remaining second region is lower than an upper surface of the semiconductor fins, and removing the mask layer.

12 Claims, 7 Drawing Sheets

(51) Int. Cl.

| | |
|---|---|
| *H01L 21/3105* | (2006.01) |
| *H01L 21/033* | (2006.01) |
| *H01L 27/088* | (2006.01) |
| *H01L 21/762* | (2006.01) |
| *H01L 29/06* | (2006.01) |
| *H01L 29/66* | (2006.01) |
| *H01L 29/78* | (2006.01) |

(52) U.S. Cl.
CPC .. *H01L 21/31053* (2013.01); *H01L 21/31111* (2013.01); *H01L 21/31144* (2013.01); *H01L 21/76224* (2013.01); *H01L 21/823431* (2013.01); *H01L 21/823437* (2013.01); *H01L 27/0886* (2013.01); *H01L 29/0649* (2013.01); *H01L 29/66545* (2013.01); *H01L 29/66795* (2013.01); *H01L 29/7851* (2013.01)

(56) References Cited

U.S. PATENT DOCUMENTS

| | | | |
|---|---|---|---|
| 2014/0264572 A1 | 9/2014 | Kim et al. | |
| 2015/0162247 A1 | 6/2015 | Choi et al. | |
| 2016/0225848 A1 | 8/2016 | Zang et al. | |
| 2016/0377982 A1* | 12/2016 | deVilliers | G03F 7/40 430/325 |

OTHER PUBLICATIONS

Ruffell 0, Directed Ribbon-Beam Capability for Novel Etching Applications, Journal of Vacuum Science & Technology B: Microelectronics and Nanometer Structures, American Institute of Physics, vol. 33, No. 6, Nov.-Dec. 2015, 5 pages.

* cited by examiner

FIN CUT PROCESS AND FIN STRUCTURE

CROSS-REFERENCES TO RELATED APPLICATIONS

The present application claims priority to Chinese patent application No. 201611046394.X, filed with the State Intellectual Property Office of People's Republic of China on Nov. 23, 2016, the content of which is incorporated herein by reference in its entirety.

FIELD OF THE INVENTION

The present invention relates to semiconductor technology, and more particularly to a semiconductor device and method for manufacturing the same.

BACKGROUND OF THE INVENTION

For improving the fin field effect transistor (FinFET) performance, distal ends of the fin of a FinFET is etched to form a recess, and a semiconductor material is epitaxially grown in the recess to introduce stress into the channel. A dummy gate structure may be formed on a shallow trench isolation (STI) to improve the morphology of the epitaxially grown semiconductor material.

BRIEF SUMMARY OF THE INVENTION

The present inventors have discovered that, because the upper surface of the STI region is lower than the upper surface of the fins, and as the features sizes of semiconductor devices decrease, the dummy gate structure on the STI region will be coupled to the fin if there is some slight deviation, i.e., a bridge is formed between the dummy gate and the fin, which may cause leakage and affect the reliability of a semiconductor device. The present inventors provide a novel solution for solving the bridging problems when manufacturing a semiconductor device.

Embodiments of the present invention provide a method for manufacturing a semiconductor device. The method may include providing a substrate structure having a substrate, one or more semiconductor fins extending in a first direction on the substrate, a hardmask layer on the semiconductor fins, and an isolation region surrounding the semiconductor fins and having an upper surface substantially flush with the hardmask layer, the isolation region including a first isolation region disposed on a side of the semiconductor fins in the first direction and a second isolation region disposed on a side of the semiconductor fins in a second direction different from the first direction. The method may also include removing the hardmask layer, etching a portion of the first isolation region above the semiconductor fins, forming a mask layer on the semiconductor fins and a remaining first isolation region, etching the second isolation region so that an upper surface of the remaining first isolation region is lower than an upper surface of the semiconductor fins, and removing the mask layer.

In one embodiment, etching the portion of the first isolation region includes removing the portion of the first isolation region above the semiconductor fins, such that an upper surface of a remaining first isolation region is substantially flush with the upper surface of the semiconductor fins.

In one embodiment, etching the portion of the first isolation region includes removing the portion of the first isolation region that is higher than the semiconductor fins so that an upper surface of a remaining first isolation region is higher than the upper surface of the semiconductor fins.

In one embodiment, forming the mask layer on the semiconductor fins and the remaining first isolation region includes forming a mask material layer covering the semiconductor fins, the remaining first isolation region, and the second isolation region, and planarizing the mask material layer such that a remaining mask material layer is substantially flush with the second isolation region, the remaining mask material layer being the mask layer.

In one embodiment, forming the mask layer on the semiconductor fins and the remaining first isolation region includes forming a mask material layer covering the semiconductor fins, the remaining first isolation region, and the second isolation region, and etching back the mask material layer so that a remaining mask material layer is substantially flush with the second isolation region, the remaining mask material layer being the mask layer.

In one embodiment, removing the portion of the first isolation region above the semiconductor fins includes a ribbon-like directional plasma etch process.

In one embodiment, removing the hardmask layer and removing the mask layer each include a wet etching process.

In one embodiment, the hardmask layer, the isolation region, and the mask layer each include silicon oxide, silicon nitride, or silicon oxynitride.

In one embodiment, the method further includes forming a first gate structure on the semiconductor fins, and forming a second gate structure on the remaining first isolation region.

Embodiments of the present invention also provide a semiconductor device, which includes a substrate, one or more semiconductor fins extending in a first direction on the substrate, and an isolation region surrounding the semiconductor fins. The isolation region includes a first isolation region and a second isolation region. The first isolation region is disposed on a side of the semiconductor fins in the first direction and has an upper surface substantially flush with an upper surface of the semiconductor fins, or the upper surface of the first isolation region is higher than the upper surface of the semiconductor fins. The second isolation region is disposed on a side of the semiconductor fins in a second direction different from the first direction and has an upper surface lower than an upper surface of the semiconductor fins.

In one embodiment, the semiconductor device further includes a first gate structure on the semiconductor fins, and a second gate structure on the first isolation region.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Figure 1:
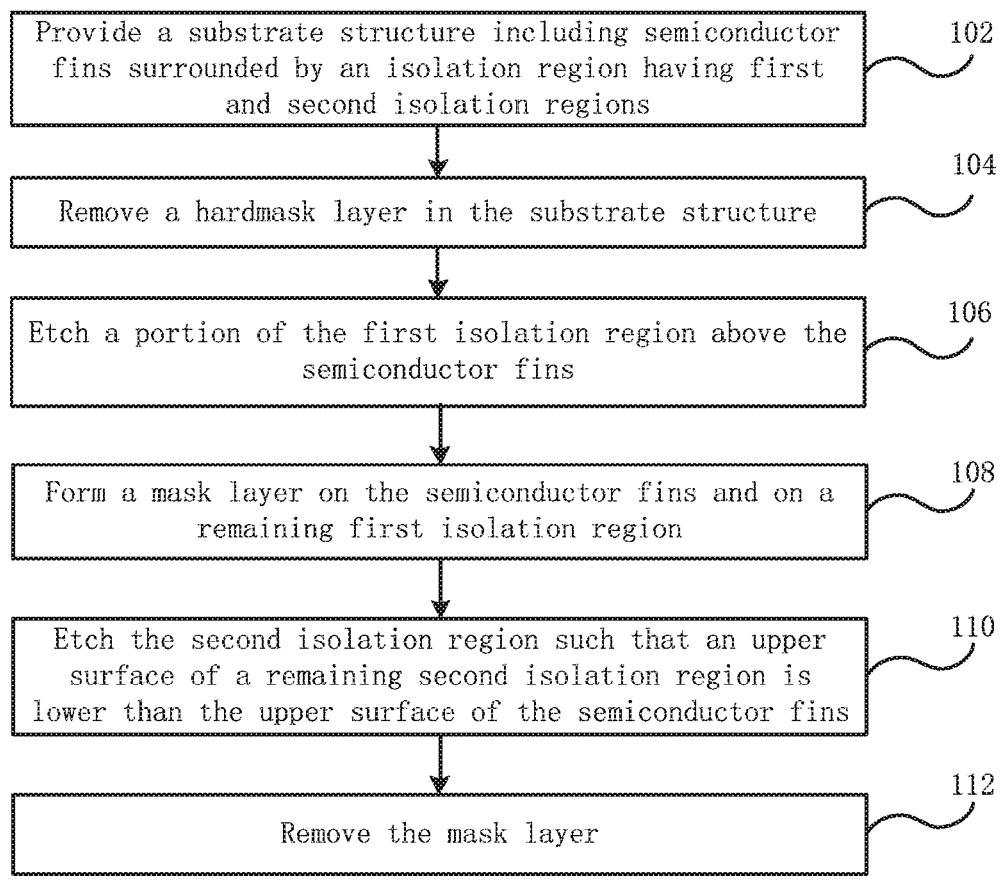
FIG. 1 is a simplified flowchart of a method for manufacturing a semiconductor device according to an embodiment of the present invention.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. In the drawings, like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The embodiments described and references in the disclosure to "one embodiment," "an embodiment," "an exemplary embodiment" indicate that the embodiments described may include a particular feature, structure, or characteristic. However, every embodiment may not necessary include the particular feature, structure or characteristic. As used throughout this disclosure, the terms "depositing" and "forming" are used interchangeably.

It should be noted that like reference numerals are used to denote like elements, and once an element has been defined in a drawings, it will not be further described in other drawings.

Embodiments of the present invention now will be described more fully hereinafter with reference to the accompanying drawings, in which embodiments of the invention are shown. This invention may, however, be embodied in many different forms and should not be construed as limited to the embodiments set forth herein.

The present inventors discovered that the leakage problems can be solved or mitigated by increasing the height of the STI region, e.g., by raising the height of the STI region as high as that of the semiconductor fins. The inventors thus propose a novel method for forming a semiconductor device having a raised STI region.

FIG. 1 is a simplified flowchart of a method for manufacturing a semiconductor device according to an embodiment of the present invention. FIGS. 2A to 7C are cross-sectional views illustrating intermediate stages of a semiconductor device in a manufacturing method according to an embodiment of the present invention. In the following description, unless otherwise specified, figures labelled NA are top or plan views of stages of the manufacturing method of a semiconductor device according to an embodiment of the present invention, figures labelled NB are cross-sectional views taken along the line B-B' of the corresponding figures NA, and figures labelled NC are cross-sectional views taken along the line C-C' of the corresponding figures NA, where N is an integer ranging from 1 to 7.

A method for manufacturing a semiconductor device according to an embodiment of the present invention will be described below with reference to FIG. 1 and FIGS. 2A through 7C.

Figure 2A:
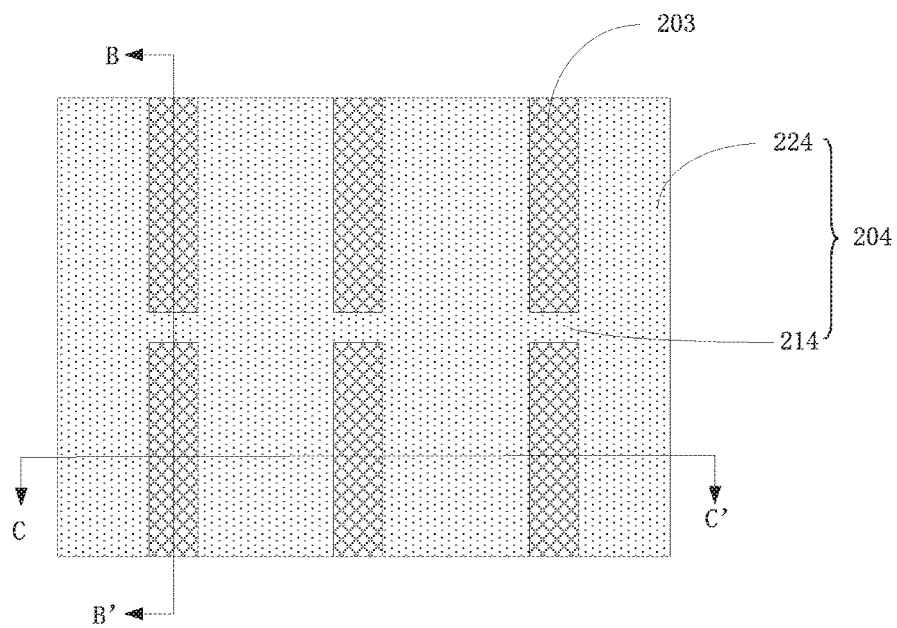
FIGS. 2A to 7C are cross-sectional views illustrating intermediate stages of an interconnect structure in a manufacturing method according to an embodiment of the present invention.
Figure 2B:
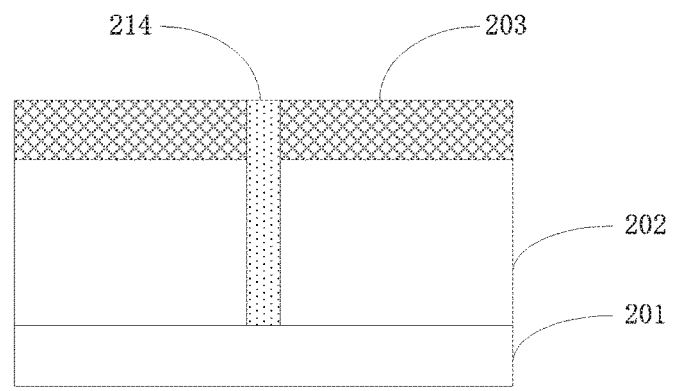
Figure 2C:
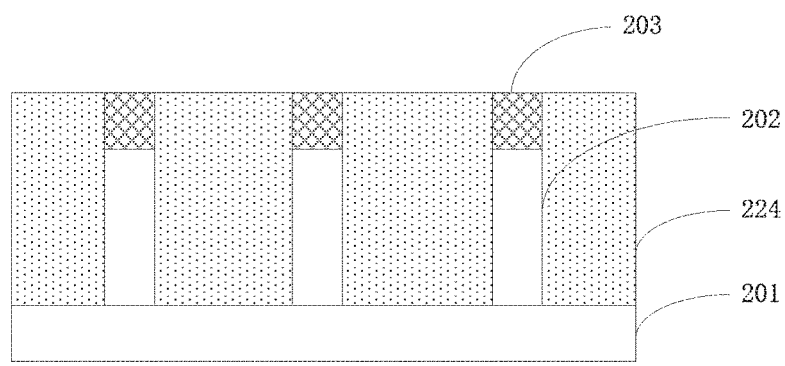

Referring to FIG. 1, a substrate structure is provided at step 102. FIG. 2A shows a plan view of a substrate structure according to an embodiment of the present invention. FIG. 2B is a cross-sectional view of the substrate structure shown in FIG. 2A taken along the line B-B', also referred to as the first direction. FIG. 2C is a cross-sectional view of the substrate structure shown in FIG. 2A taken along the line C-C', also referred to as the second direction.

Referring to FIGS. 2A, 2B, and 2C, the substrate structure may include a substrate 201. Substrate 201 may be a silicon substrate, a substrate of a group III-V semiconductor material, an insulator-on-silicon (SOI) substrate, and the like.

The substrate structure may also include one or more semiconductor fins 202 on substrate 201 and extending in the first direction (i.e., along the line B-B'), and a hardmask layer 203 on semiconductor fins 202. The first direction is the direction along the channel of a FinFET device. Semiconductor fins 202 may be formed of the same material as or of a different material than substrate 201. Hardmask layer 203 may include silicon oxide, silicon nitride, or silicon oxynitride. In one embodiment, hardmask layer 203 may include silicon nitride.

The substrate structure may also include an isolation region 204 surrounding semiconductor fins 202. Isolation region 204 has an upper surface substantially flush with an upper surface of hardmask layer 203. As used herein, the term "substantially flush" means that the upper surfaces of the isolation region and the hardmask layer are flush or coplanar within an acceptable process standard deviation range. Isolation region 204 includes a first isolation region 214 and a second isolation region 224. First isolation region 214 is located on sides of semiconductor fins 202 in the first direction (i.e., the direction along the line B-B'), and the second isolation region 224 is located on sides of semiconductor fins 202 in the second direction different from the first direction (i.e., the direction along the line C-C'). The second direction may be, for example, substantially perpendicular to the first direction, also referred to as the direction perpendicular to the channel. In one embodiment, isolation region 204 may include a dielectric material, such as an oxide, a nitride, an oxynitride material.

It will be appreciated that in the case where the substrate structure includes multiple semiconductor fins 202 extending in the first direction, the isolation region between semiconductor fins 202 in the first direction is referred to as the first isolation region. In the case where the substrate structure includes multiple semiconductor fins 202 extending in the second direction, the isolation region between semiconductor fins 202 in the second direction is referred to as the second isolation region.

The substrate structure may be formed, for example, by providing an initial substrate, forming a patterned initial hardmask layer on the initial substrate, etching the initial substrate using the patterned initial hardmask layer as a mask to form a substrate, forming a first semiconductor fin on the substrate, and forming a first hardmask layer on the first semiconductor fin, cutting off the first semiconductor fin and the first hard mask layer using, e.g., a single diffusion break (SDB) process to form semiconductor fins and the hardmask layer on the semiconductor fins, and forming an isolation material (e.g., by deposition) and a spacer material. Thereafter, a planarization (e.g., CMP) process is performed on the isolation material to form the isolation region.

Figure 3A:
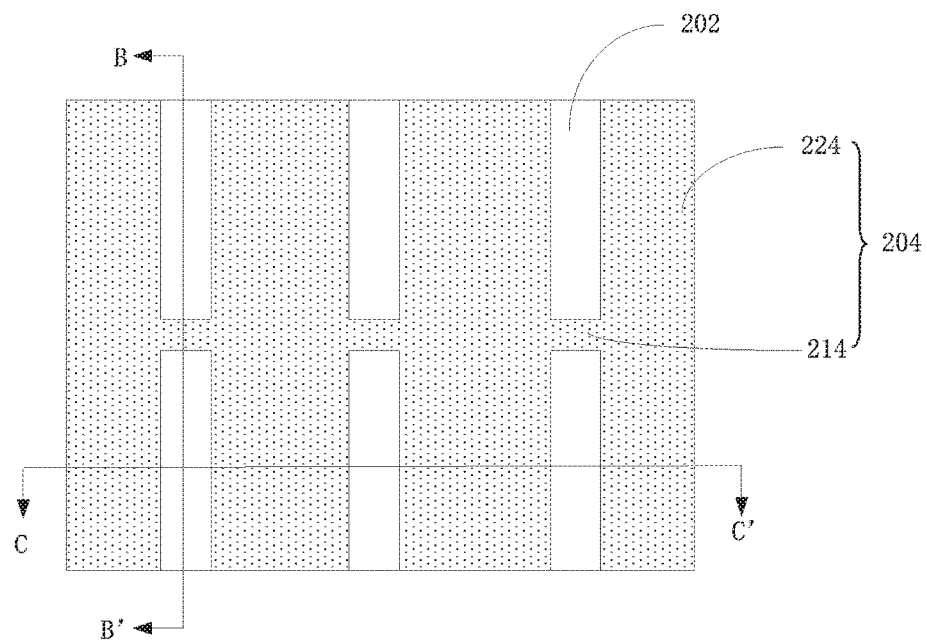
Figure 3B:
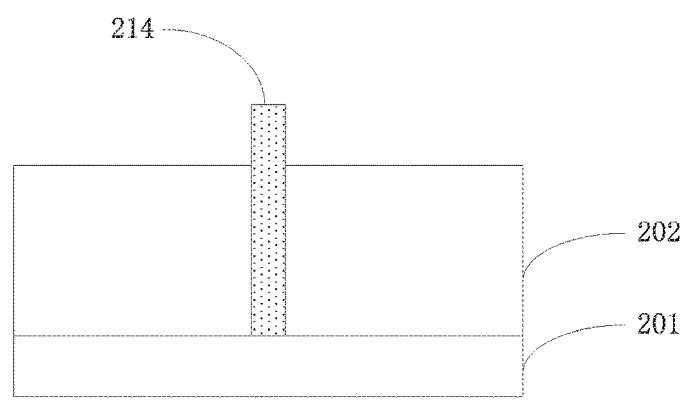
Figure 3C:
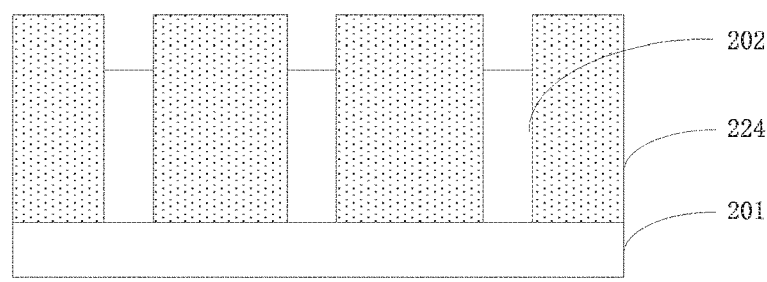

Referring back to FIG. 1, in step 104, hardmask layer 203 is removed, as shown in FIGS. 3A, 3B, and 3C. For example, hardmask layer 203 may be removed using a wet etching process. After removing hardmask layer 203, semiconductor fins 202 and a portion of first isolation region 214 above (higher than) the semiconductor fins 202 is exposed.

Next, in step 106, an etch process is performed on the portion of first isolation region 214 that is above (higher than) semiconductor fins 202.

Figure 4A:
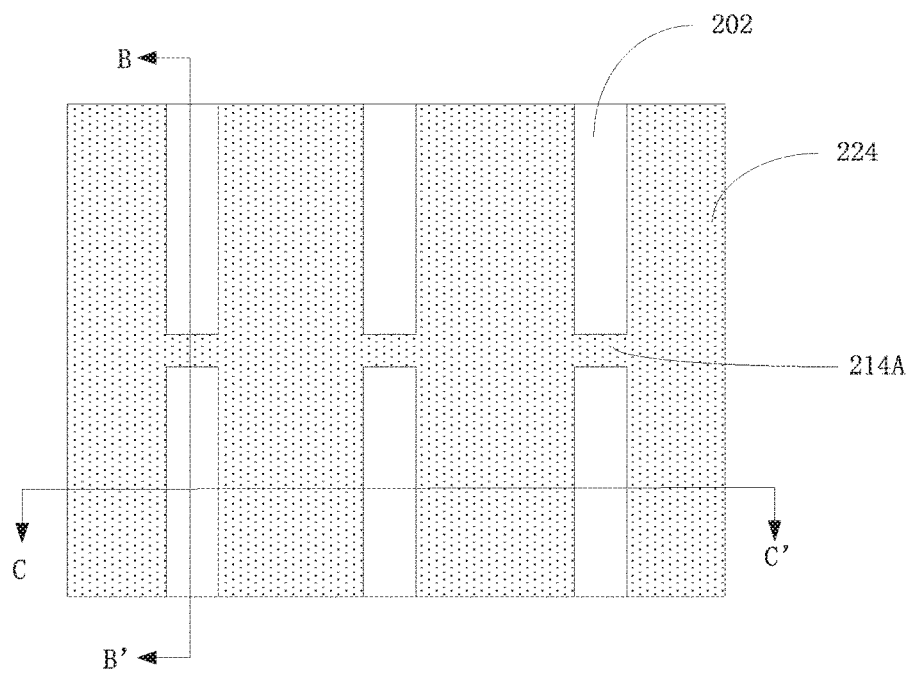
Figure 4B:
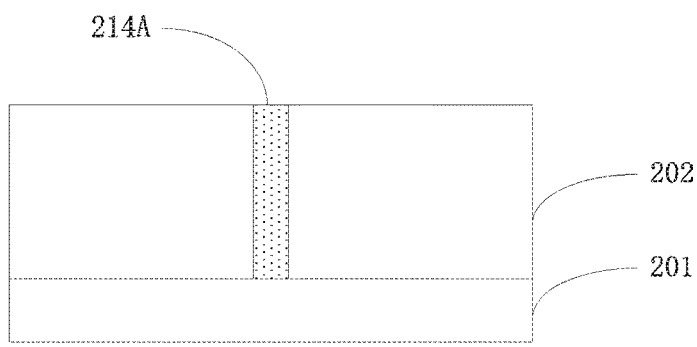
Figure 4C:
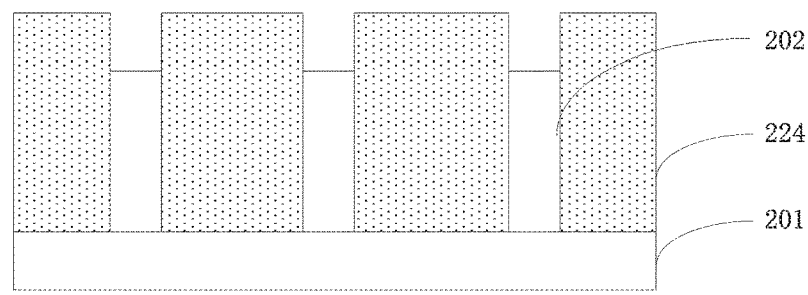

In one embodiment, referring to FIGS. 4A, 4B, and 4C, the entire portion of first isolation region 214 that is above (higher than) semiconductor fin 202 is removed, so that a remaining first isolation region has an upper surface substantially flush with an upper surface of semiconductor fin 202. In another embodiment, only a portion of first isolation region 214 that is above semiconductor fin 202 is removed, so that the upper surface of remaining first isolation region 214 is higher than the upper surface of semiconductor fin 202.

In one embodiment, a portion of first isolation region 214 above semiconductor fins 202 may be etched using a ribbon-like directional plasma etch process. The ribbon-like directional plasma etch process can etch a material in a certain direction while materials in other directions are basically not etched or etched only very little. Thus, only a portion of first isolation region 214 disposed on a side of semiconductor fin 202 in the first direction is etched using the ribbon-like directional plasma etch process, and a portion of first isolation region 214 disposed on a side of semiconductor fin 202 in the second direction is not etched.

Figure 5A:
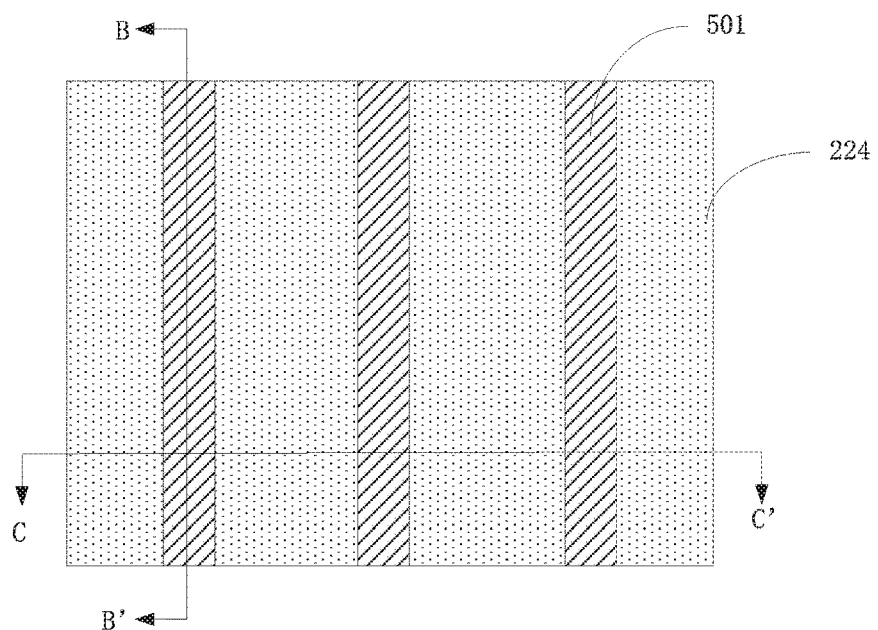
Figure 5B:
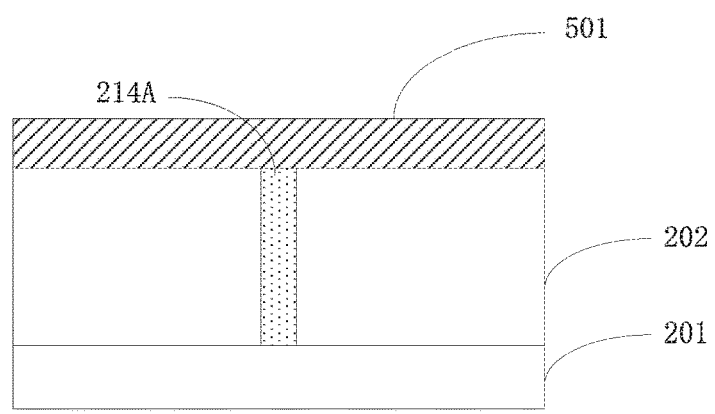
Figure 5C:
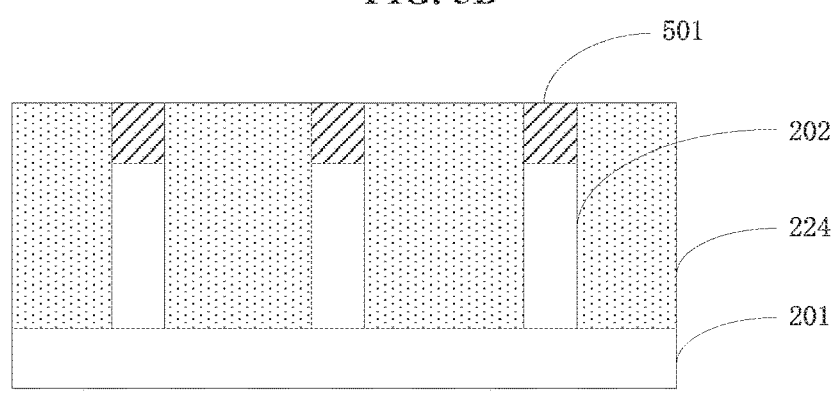

Next, in step 108, a mask layer 501 is formed on semiconductor fins 202 and on a remaining first isolation region 214A, as shown in FIGS. 5A, 5B, and 5C.

In one embodiment, a mask material layer (not shown) may be formed on semiconductor fins 202, remaining first isolation region 214A, and second isolation region 224. Thereafter, in one embodiment, a planarization (e.g., a chemical mechanical polishing) process may be performed on the mask material layer to remove a portion of the mask material layer on second isolation region 224 so that a remaining mask material layer is substantially flush with second isolation region 224, the remaining mask material layer is a mask layer 501. Alternatively, in another embodiment, the mask material layer may be etched back to remove a portion of the mask material layer on second isolation region 224 so that a remaining mask material layer is substantially flush with second isolation region 224, the remaining mask material layer is mask layer 501. In an exemplary embodiment, mask layer 501 may include silicon nitride, silicon oxide, or silicon oxynitride.

Figure 6A:
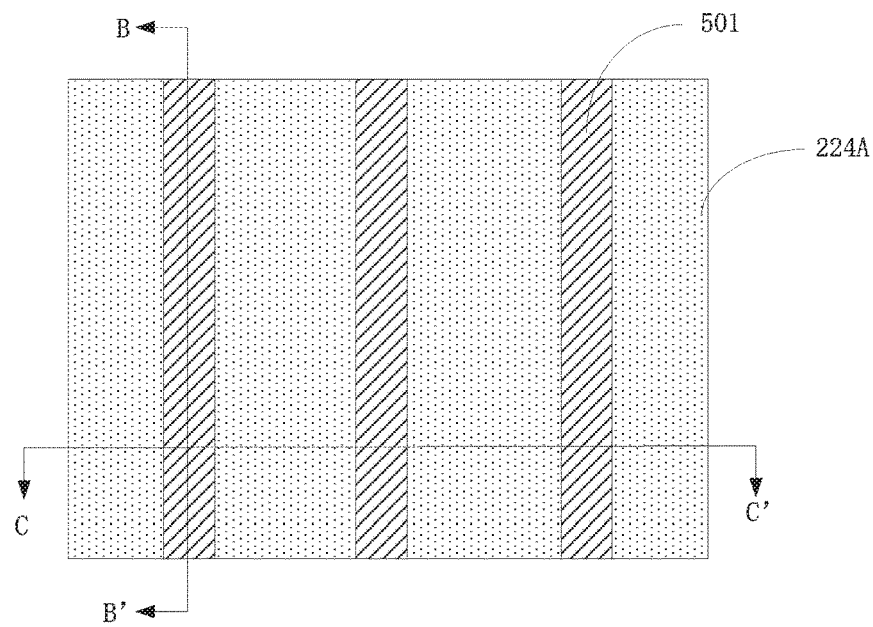
Figure 6B:
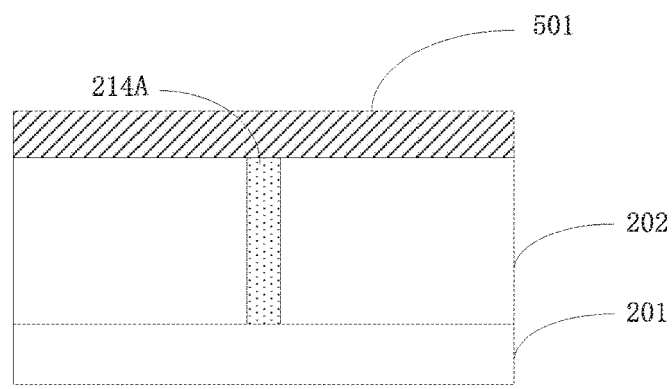
Figure 6C:
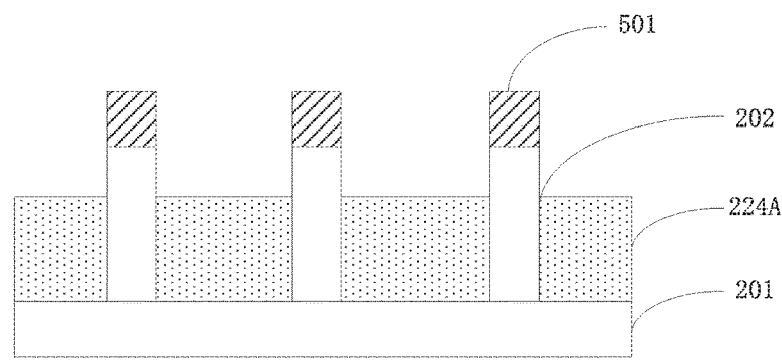

Next, in step 110, second isolation region 224 is etched so that an upper surface of a remaining second isolation region 224A is lower than an upper surface of semiconductor fins 202, as shown in FIGS. 6A, 6B, and 6C. For example, second isolation region 224 may be etched using a dry etch process.

Figure 7A:
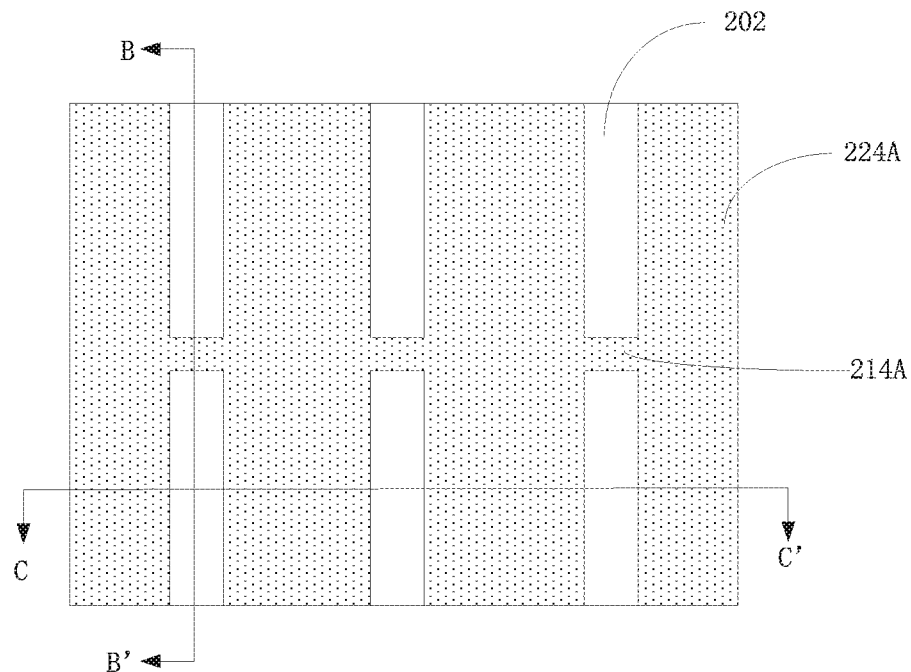
Figure 7B:
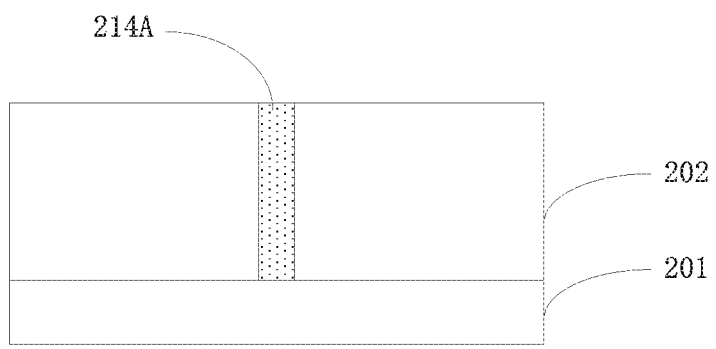
Figure 7C:
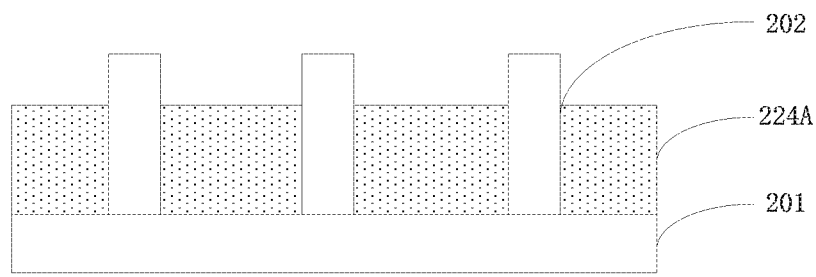

Next, in step 112, mask layer 501 is removed, as shown in FIGS. 7A, 7B, and 7C. For example, mask layer 501 may be removed using a wet etch process.

Referring to FIGS. 7B and 7C, the upper surface of remaining first isolation region 214A is substantially flush with the upper surface of semiconductor fins 202, and the upper surface of remaining second isolation region 224A is lower than the upper surface of semiconductor fins 202. Further, as described above, the upper surface of remaining first isolation region 214A may be higher than the upper surface of semiconductor fins 202 in the case where a portion of first isolation region 214A that is above (higher than) semiconductor fins 202 is removed.

Thereafter, a first gate structure (not shown) may be formed on semiconductor fins 202, and a second gate structure (not shown) may be formed on remaining first isolation region 214A.

The above-described manufacturing method provides an elevated isolation region, i.e., a first isolation region has an upper surface that is substantially flush with an upper surface of the semiconductor fins or higher than the upper surface of the semiconductor fins, that is, the height of the first isolation region has improved. Thus, a dummy gate structure (corresponding to a subsequently formed second gate structure) formed on the first isolation region will not form a bridge with the semiconductor fins even if there is some deviation in the dummy gate structure, thereby reducing leakage caused by the bridge formed between the dummy gate structure with the semiconductor fins and improving the reliability of the semiconductor device.

Embodiments of the present invention also provide a semiconductor device. Referring to FIGS. 7A, 7B, and 7C, the semiconductor device includes a substrate 201, one or more semiconductor fins 202 on substrate 201 and extending in a first direction, and an isolation region surrounding semiconductor fins 202. The isolation region includes a first isolation region 214A and a second isolation region 224A.

First isolation region 214A is disposed on a side of semiconductor fins 202 in the first direction and has an upper surface substantially flush with an upper surface of semiconductor fins 202, as shown in FIG. 7B, or the upper surface of first isolation region 214A is higher than the upper surface of semiconductor fins 202. Second isolation region 224A is disposed on a side of semiconductor fins 202 in a second direction different from the first direction and has an upper surface that is lower that the upper surface of semiconductor fins 202, as shown in FIG. 7C.

In one embodiment, the semiconductor device includes may also include a first gate structure (not shown) on semiconductor fins 202 and a second gate structure (not shown) on first isolation region 214A.

The foregoing descriptions of specific embodiments of the present invention have been presented for purpose of illustration and description. They are not intended to be exhaustive or to limit the invention to the precise forms disclosed, and obviously many modifications and variations are possible in light of the above disclosure. The exemplary embodiment has been described in order to best explain the principles of the invention and its practical applications. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for manufacturing a semiconductor device, the method comprising:
    providing a substrate structure including a substrate, one or more semiconductor fins extending in a first direction on the substrate, a hardmask layer on the one or more semiconductor fins, and an isolation region surrounding the one or more semiconductor fins and including a first isolation region disposed on a side of the semiconductor fins in the first direction and having an upper surface substantially flush with the hardmask layer and a second isolation region disposed on a side of the semiconductor fins in a second direction different from the first direction and having an upper surface substantially flush with the hardmask layer;
    removing the hardmask layer;
    etching a portion of the first isolation region above the one or more semiconductor fins;
    forming a mask layer on the one or more semiconductor fins and a remaining first isolation region;
    etching the second isolation region so that an upper surface of a remaining second isolation region is lower than an upper surface of the one or more semiconductor fins; and
    removing the mask layer.

2. The method of claim 1, wherein etching the portion of the first isolation region comprises:
    removing the portion of the first isolation region above the one or more semiconductor fins so that an upper surface of a remaining first isolation region is substantially flush with the upper surface of the one or more semiconductor fins.

3. The method of claim 1, wherein etching the portion of the first isolation region comprises:
    removing the portion of the first isolation region that is higher than the one or more semiconductor fins so that an upper surface of a remaining first isolation region is higher than the upper surface of the one or more semiconductor fins.

4. The method of claim 1, wherein forming the mask layer on the one or more semiconductor fins and the remaining first isolation region comprises:
    forming a mask material layer covering the one or more semiconductor fins, the remaining first isolation region, and the second isolation region;
    planarizing the mask material layer so that a remaining mask material layer is substantially flush with the second isolation region, the remaining mask material layer being the mask layer.

5. The method of claim 1, wherein forming the mask layer on the one or more semiconductor fins and the remaining first isolation region comprises:
    forming a mask material layer covering the semiconductor fins, the remaining first isolation region, and the second isolation region;
    etching back the mask material layer so that a remaining mask material layer is substantially flush with the second isolation region, the remaining mask material layer being the mask layer.

6. The method of claim 1, wherein removing the portion of the first isolation region above the one or more semiconductor fins comprises a ribbon-like directional plasma etch process.

7. The method of claim 1, wherein removing the hardmask layer comprises a wet etching process.

8. The method of claim 1, wherein removing the mask layer comprises a wet etching process.

9. The method of claim 1, wherein the hardmask layer, the isolation region, and the mask layer each comprise silicon oxide, silicon nitride, or silicon oxynitride.

10. The method of claim 1, further comprising:
    forming a first gate structure on the one or more semiconductor fins; and
    forming a second gate structure on the remaining first isolation region.

11. The method of claim 1, wherein the second direction is perpendicular to the first direction.

12. The method of claim 1, wherein providing the substrate structure comprises:
    providing an initial substrate;
    forming a patterned initial hardmask layer on the initial substrate;
    etching the initial substrate using the patterned initial hardmask layer as a mask to form the substrate;
    forming a semiconductor fin on the substrate;
    forming a first hardmask layer on the semiconductor fin;
    cutting off the semiconductor fin and the first hardmask layer to form the one or more semiconductor fins and the hardmask layer on the one or more semiconductor fins; and
    depositing an isolation material to form the isolation region.

* * * * *